(12) United States Patent
Tanabe

(10) Patent No.: US 10,859,642 B2
(45) Date of Patent: Dec. 8, 2020

(54) MAGNETIC SENSOR

(71) Applicant: TDK CORPORATION, Tokyo (JP)

(72) Inventor: Kei Tanabe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 41 days.

(21) Appl. No.: 16/078,565

(22) PCT Filed: Oct. 20, 2016

(86) PCT No.: PCT/JP2016/081106
§ 371 (c)(1),
(2) Date: Aug. 21, 2018

(87) PCT Pub. No.: WO2017/149831
PCT Pub. Date: Sep. 8, 2017

(65) Prior Publication Data
US 2019/0056460 A1 Feb. 21, 2019

(30) Foreign Application Priority Data
Mar. 3, 2016 (JP) .................................. 2016-040576

(51) Int. Cl.
*G01R 33/09* (2006.01)
*G01R 33/02* (2006.01)
*H01L 43/08* (2006.01)

(52) U.S. Cl.
CPC ............. *G01R 33/09* (2013.01); *G01R 33/02* (2013.01); *H01L 43/08* (2013.01)

(58) Field of Classification Search
None
See application file for complete search history.

(56) References Cited

U.S. PATENT DOCUMENTS

2009/0284254 A1* 11/2009 Kasajima ........... G01R 33/0005
324/207.21
2013/0299930 A1 11/2013 Paci et al.

FOREIGN PATENT DOCUMENTS

| JP | 5500785 B2 | 5/2014 |
| JP | 2014182096 A | 9/2014 |

* cited by examiner

*Primary Examiner* — Jas A Sanghera
(74) *Attorney, Agent, or Firm* — Young Law Firm, P.C.

(57) ABSTRACT

An object of the present invention is to provide a magnetic sensor having enhanced magnetic detection sensitivity by bending magnetic flux more largely. A magnetic sensor includes magnetic detection elements MR1 and MR2 positioned on a plane P separating a first space S1 and a second space S2, a first magnetic member 31 disposed in the first space S1 so as to be between the magnetic detection elements MR1 and MR2 when viewed in the z-direction, and a second magnetic member 32 disposed in the second space S2. The magnetic detection element MR1 is positioned between the first magnetic member 31 and a first part 32a of the second magnetic member 32 when viewed in the z-direction. The magnetic detection element MR2 is positioned between the first magnetic member 31 and a second part 32b of the second magnetic member 32 when viewed in the z-direction. According to the present invention, magnetic flux collected by the first magnetic member is attracted to the first and second parts of the second magnetic member, allowing the magnetic flux to be bent more largely. Thus, the magnetic detection sensitivity of the magnetic sensor can be enhanced.

19 Claims, 9 Drawing Sheets

MAGNETIC SENSOR

TECHNICAL FIELD

The present invention relates to a magnetic sensor and, more particularly, to a magnetic sensor provided with a magnetic member for collecting magnetic flux in a magnetic detection element.

BACKGROUND ART

A magnetic sensor using a magnetic resistance element is widely used in an ammeter, a magnetic encoder, and the like. The magnetic sensor is sometimes provided with a magnetic member for collecting magnetic flux in a magnetic detection element and, in this case, the magnetic member is disposed offset to the magnetic detection element (see Patent Documents 1 and 2). With this configuration, the direction of the magnetic flux is bent in a magnetism fixing direction by the magnetic member, thereby enabling high-sensitivity detection.

CITATION LIST

Patent Document

[Patent Document 1] Japanese Patent No. 5,500,785
[Patent Document 2] JP 2014-182096 A

SUMMARY OF INVENTION

Technical Problem to be Solved by Invention

However, only by making the magnetic member offset to the magnetic detection element as in the magnetic sensors described in Patent Documents 1 and 2, the magnetic flux cannot be bent sufficiently.

It is therefore an object of the present invention to provide a magnetic sensor whose magnetic detection sensitivity is enhanced by largely bending the magnetic flux.

Means for Solving Problem

A magnetic sensor according to the present invention includes a plurality of magnetic detection elements including at least first and second magnetic detection elements positioned on a plane separating a first space and a second space, a first magnetic member disposed in the first space so as to be between the first and second magnetic detection elements when viewed in a first direction crossing the plane, and a second magnetic member disposed in the second space and having at least first and second parts. The first magnetic detection element is positioned between the first magnetic member and the first part of the second magnetic member when viewed in the first direction, and the second magnetic detection element is positioned between the first magnetic member and the second part of the second magnetic member when viewed in the first direction.

According to the present invention, magnetic flux collected by the first magnetic member is attracted to the first and second parts of the second magnetic member, allowing the magnetic flux to be bent more largely. Thus, the magnetic detection sensitivity of the magnetic sensor can be enhanced. The first and second magnetic members are each preferably made of a soft magnetic material.

In the present invention, the second magnetic member preferably further includes a third part connecting the first and second parts, and the first and second parts each preferably have a shape protruding toward the plane from the third part. This increases the force of bending the magnetic flux, thereby making it possible to enhance the magnetic detection sensitivity of the magnetic sensor.

In this case, end faces of the first and second parts are each preferably positioned in the vicinity of the plane. This allows the magnetic flux to show a more acute bend, making it possible to further enhance the magnetic detection sensitivity of the magnetic sensor.

In the present invention, a second direction that is parallel to the plane and is a direction in which the first and second magnetic detection elements are arranged is preferably set as the magnetization fixing direction of the plurality of magnetic detection elements. This allows the magnetic flux to be bent largely in the magnetization fixing direction, thereby making it possible to enhance the magnetic detection sensitivity of the magnetic sensor.

In this case, the length of the first magnetic member in a third direction that is parallel to the plane and crosses the magnetization fixing direction is preferably larger than the length of each of the plurality of magnetic detection elements in the third direction. Further, the length of the second magnetic member in the third direction is also preferably greater than the length of each of the plurality of magnetic detection elements in the third direction. This allows a magnetic field parallel to the magnetization fixing direction to be obtained over a wider area in the third direction, making it possible to enhance the magnetic detection sensitivity of the magnetic sensor.

The magnetic sensor according to the present invention preferably further includes a first substrate on which the plurality of magnetic detection elements are formed. The first magnetic member is preferably fixed to one surface of the first substrate, and the second magnetic member is preferably fixed to the other surface of the first substrate. This can simplify the configuration of the magnetic sensor.

In this case, the magnetic sensor according to the present invention preferably further includes a second substrate having a housing part, and at least a part of the first substrate is preferably housed in the housing part. This reduces the level difference between the first and second substrates, thereby facilitating electrical connection between the first and second substrates. Further, in this case, the housing part preferably penetrates the second substrate. This allows the size of the second magnetic member to be increased.

Advantageous Effects of Invention

According to the present invention, there can be provided a magnetic sensor having enhanced magnetic detection sensitivity by largely bending magnetic flux.

MODE FOR CARRYING OUT THE INVENTION

Preferred embodiments of the present invention will now be explained in detail with reference to the drawings.

First Embodiment

Figure 1:
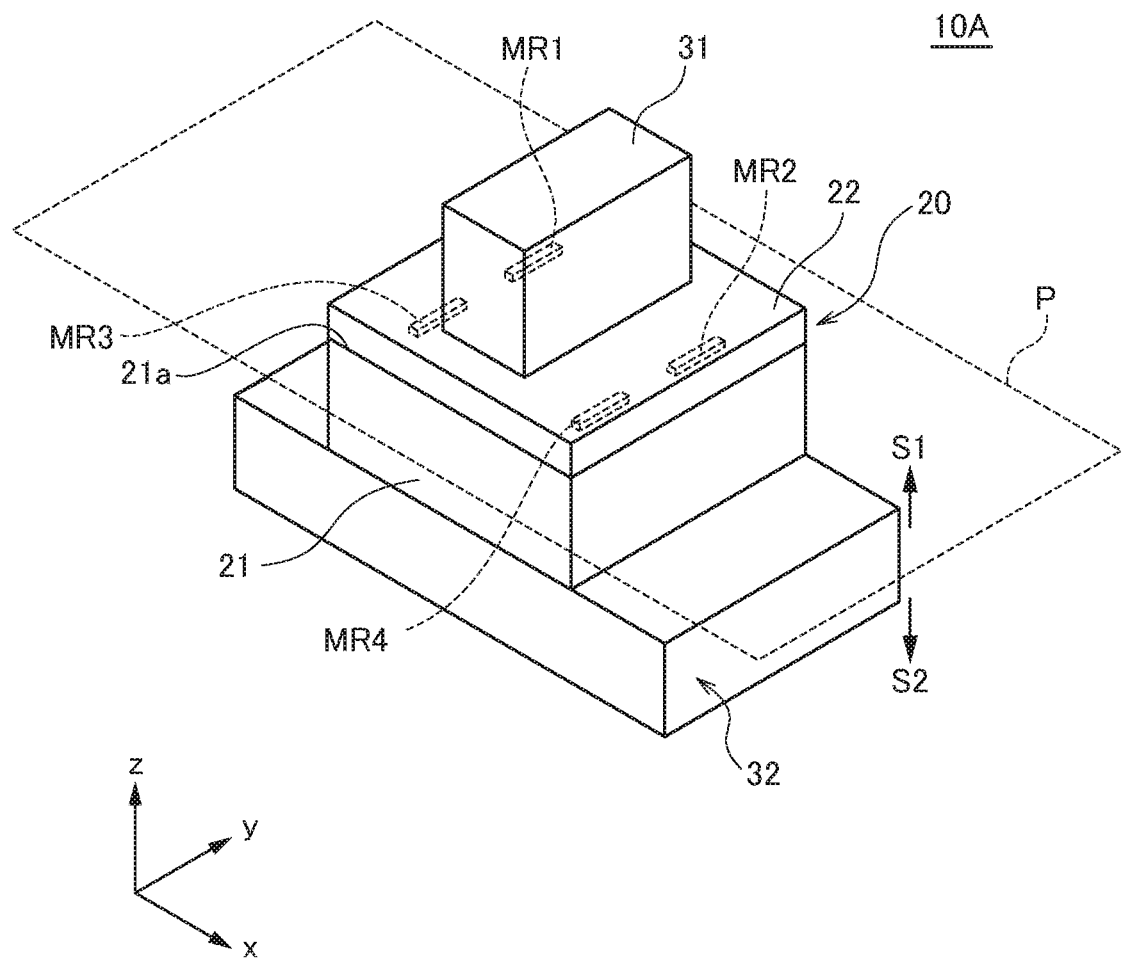
FIG. 1 is a schematic perspective view illustrating the outer appearance of a magnetic sensor 10A according to a first embodiment of the present invention.
Figure 2:
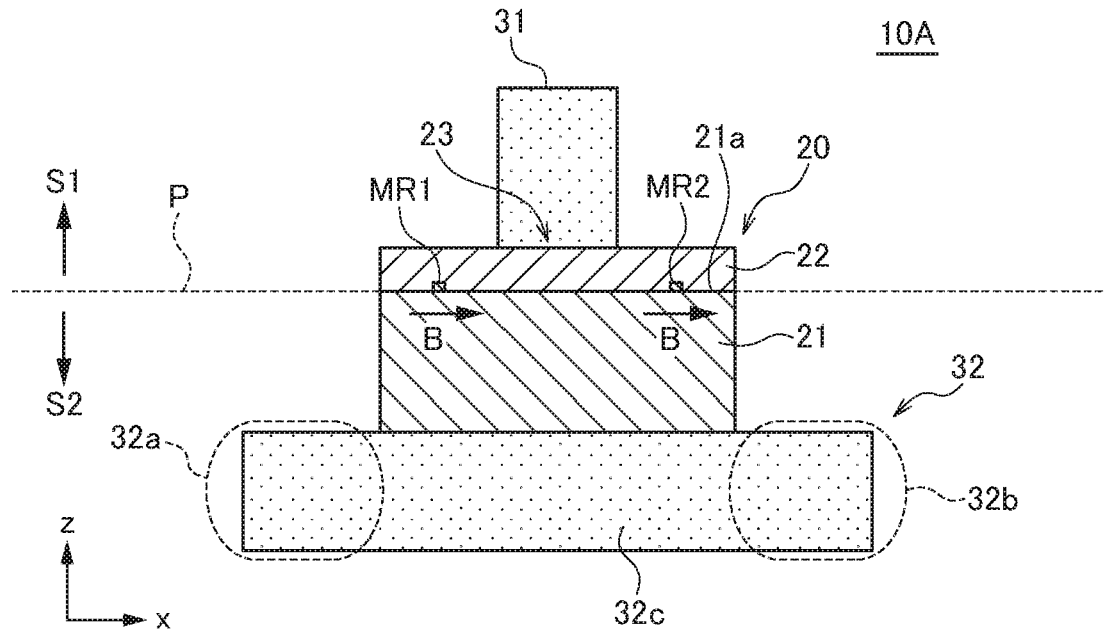
FIG. 2 is a cross-sectional view of the magnetic sensor 10A.
Figure 3:
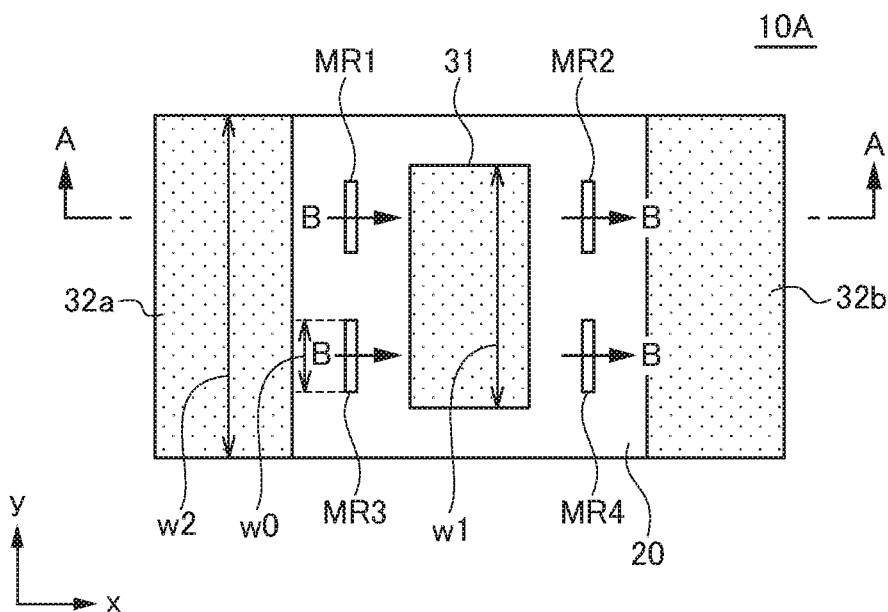
FIG. 3 is a top view of the magnetic sensor 10A.

FIG. 1 is a schematic perspective view illustrating the outer appearance of a magnetic sensor 10A according to the first embodiment of the present invention. FIG. 2 is a cross-sectional view of the magnetic sensor 10A, and FIG. 3 is a top view of the magnetic sensor 10A. In particular, FIG. 2 illustrates the cross section taken along line A-A of FIG. 3.

As illustrated in FIGS. 1 to 3, the magnetic sensor 10A according to the present embodiment includes a sensor chip 20 and first and second magnetic members 31 and 32 fixed to the sensor chip 20.

The sensor chip 20 has a first substrate 21 having a substantially rectangular parallelepiped shape, and four magnetic detection elements MR1 to MR4 are formed on an element forming surface 21a of the first substrate 21. The element forming surface 21a is an xy plane and constitutes a part of plane P that separates a first space S1 in which the first magnetic member 31 is disposed from a second space S2 in which the second magnetic member 32 is disposed. The element forming surface 21a is covered with an insulating film 22. A common method to produce the sensor chip 20 is to form a large number of sensor chips 20 at a time and then to separate them for taking multiple sensor chips; however, the present invention is not limited to this, and the sensor chips 20 may be individually produced.

There is no particular restriction on the type of magnetic detection elements MR1 to MR4 as long as physical properties thereof are changed by magnetic flux density. In the present embodiment, a magnetoresistive element (MR element) whose electric resistance is changed in accordance with the direction of a magnetic field is used. The magnetization fixing directions of the magnetic detection elements MR1 to MR4 are all aligned in a direction (positive side in the x-direction) denoted by the arrows B in FIGS. 2 and 3.

The first and second magnetic members 31 and 32 are each a block made of a soft magnetic material, such as ferrite, having high permeability and each have a rectangular parallelepiped shape in the present embodiment. The first magnetic member 31 is fixed to one surface side of the sensor chip 20 and is thus positioned in the first space S1. On the other hand, the second magnetic member 32 is fixed to the other surface side of the sensor chip 20 and is thus positioned in the second space S2.

The first magnetic member 31 is fixed to a mounting area 23 defined on the one surface of the sensor chip 20. The mounting area 23 is positioned at the center portion of the sensor chip 20 in a plan view (that is, when viewed in the z-direction which is a first direction) and between the magnetic detection elements MR1, MR3 and the magnetic detection elements MR2, MR4. Specifically, the magnetic detection elements MR1 and MR2 are arranged in the x-direction which is a second direction, and magnetic detection elements MR3 and MR4 are arranged in the x-direction. Further, the magnetic detection elements MR1 and MR3 are arranged in the y-direction which is a third direction, and magnetic detection elements MR2 and MR4 are arranged in the y-direction. As a result, the magnetic detection elements MR1 and MR3 are positioned on the negative side in the x-direction with respect to the first magnetic member 31 in a plan view, and the magnetic detection elements MR2 and MR4 are positioned on the positive side in the x-direction with respect to the first magnetic member 31 in a plan view.

The first magnetic member 31 plays a role of collecting magnetic flux in the z-direction, bending a part of the collected magnetic flux toward the negative side in the x-direction to discharge the same to the magnetic detection elements MR1 and MR3 side, and bending another part of the collected magnetic flux toward the positive side in the x-direction to discharge the same to the magnetic detection elements MR2 and MR4 side. As a result, the magnetic flux given to the magnetic detection elements MR1, MR3 and the magnetic flux given to the magnetic detection elements MR2, MR4 are mutually in opposite directions. As described above, the magnetization fixing directions of the magnetic detection elements MR1 to MR4 are aligned in the positive x-direction denoted by arrows B, so that the magnetic detection elements MR1 to MR4 have sensitivity to a magnetic flux component in the x-direction.

Assuming that the length of each of the magnetic detection elements MR1 to MR4 in the y-direction is w0 and that the width of the first magnetic member 31 in the y-direction is w1, w0<w1 is preferably satisfied. As a result, the magnetic flux bent in the x-direction by the first magnetic member 31 covers a wider area of each of the magnetic detection elements MR1 to MR4 in the y-direction. That is, a magnetic field component in the x-direction can be obtained over the wider area in the y-direction, thereby enhancing magnetic detection sensitivity.

There is no particular restriction on the height of the first magnetic member 31 in the z-direction; however, by increasing the height thereof in the z-direction, selectivity of the magnetic flux in the z-direction can be enhanced. However, when the height of the first magnetic member 31 in the z-direction is excessively high, support for the first magnetic member 31 may become unstable, so that it is preferable to increase the height to the extent that stable support can be ensured.

The second magnetic member 32 is fixed to the other surface of the sensor chip 20. In the present embodiment, the second magnetic member 32 entirely covers the other surface of the sensor chip 20; however, the present invention is not limited to this. As illustrated in FIGS. 1 to 3, the length of the second magnetic member 32 in the x-direction is larger than the length of the sensor chip 20 in the x-direction and, accordingly, there exist first and second parts 32a and 32b protruding in the x-direction from the sensor chip 20 in a plan view.

The first part 32a is a part that protrudes from the sensor chip 20 to the negative side in the x-direction. Thus, as illustrated in FIG. 3, the magnetic detection elements MR1 and MR3 are positioned between the first magnetic member 31 and the first part 32a of the second magnetic member 32 in a plan view. On the other hand, the second part 32b is a part that protrudes from the sensor chip 20 to the positive side in the x-direction. Thus, as illustrated in FIG. 3, the magnetic detection elements MR2 and MR4 are positioned between the first magnetic member 31 and the second part 32b of the second magnetic member 32 in a plan view.

In the present embodiment, the first part 32a and the second part 32b are connected by a third part 32c, and the parts 32a to 32c have the same thickness in the z-direction. Thus, in the present embodiment, the second magnetic member 32 has a simple plate-like shape.

The second magnetic member 32 plays a role of further bending the direction of the magnetic flux bent by the first magnetic member 31. Specifically, the magnetic flux bent in the negative side in the x-direction by the first magnetic member 31 and discharged to the magnetic detection elements MR1 and MR3 side is further bent to the negative side in the x-direction by the first part 32a of the second magnetic member 32. Similarly, the magnetic flux bent in the positive side in the x-direction by the first magnetic member 31 and discharged to the magnetic detection elements MR2 and MR4 side is further bent to the positive side in the x-direction by the second part 32b of the second magnetic member 32. As a result, the x-direction component of the magnetic flux becomes larger, thereby further enhancing the sensitivity of detecting a magnetic field as compared with a case where the second magnetic member 32 is absent.

Assuming that the width of the second magnetic member 32 in the y-direction is w2, w0<w2 is preferably satisfied. As a result, force with which the second magnetic member 32 bends the magnetic flux in the x-direction is exerted over a wider area of each of the magnetic detection elements MR1 to MR4 in the y-direction, so that a magnetic field component in the x-direction can be obtained over the wider area in the y-direction.

There is no particular restriction on the thickness of the second magnetic member 32 in the z-direction; however, by increasing the thickness thereof in the z-direction, sensitivity can be enhanced.

Figure 4:
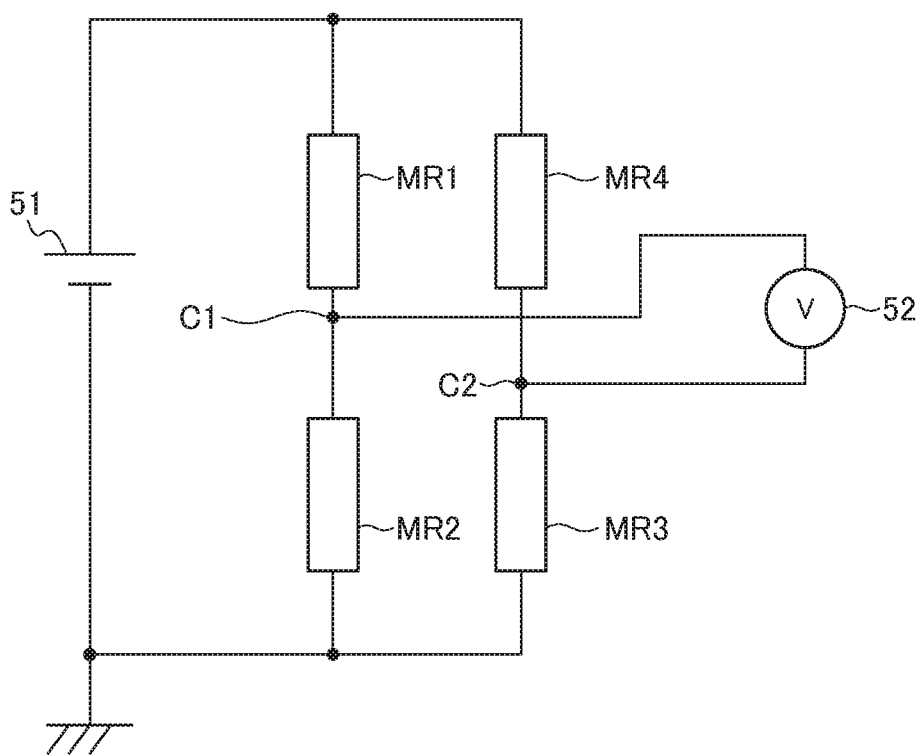
FIG. 4 is a circuit diagram for explaining the connection relationship between the magnetic detection elements MR1 to MR4.

FIG. 4 is a circuit diagram for explaining the connection relationship between the magnetic detection elements MR1 to MR4.

In the example of FIG. 4, a constant voltage source 51 is used. Between both ends of the constant voltage source 51, the magnetic detection elements MR1 and MR2 are connected in series in this order, and the magnetic detection elements MR3 and MR4 are connected in series in this order. A voltage detection circuit 52 is connected between a connection point C1 between the magnetic detection elements MR1 and MR2 and a connection point C2 between the magnetic detection elements MR3 and MR4, whereby the level of an output voltage appearing between the connection points C1 and C2 is detected.

The magnetic detection elements MR1 and MR3 are disposed on one side (negative side in the x-direction) with respect to the first magnetic member 31 in a plan view, and the magnetic detection elements MR2 and MR4 are disposed on the other side (positive side in the x-direction) with respect to the first magnetic member 31 in a plan view, so that the magnetic detection elements MR1 to MR4 constitute a differential bridge circuit, making it possible to detect at a high sensitivity a change in electric resistance of each of the magnetic detection elements MR1 to MR4 according to the magnetic flux density.

Specifically, the magnetic flux in the z-direction attracted by the first magnetic member 31 is mainly output to the mounting area 23 of the sensor chip 20 and returned to the source of the magnetic flux after traveling on both sides in the x-direction. At this time, since the magnetic detection elements MR1 to MR4 have the same magnetization fixing direction, a difference occurs between the resistance change amounts of the magnetic detection elements MR1 and MR3 positioned on the one side with respect to the mounting area 23 and the resistance change amounts of the magnetic detection elements MR2 and MR4 positioned on the other side with respect to the mounting area 23. The difference is amplified twofold by the differential bridge circuit illustrated in FIG. 4 and detected by the voltage detection circuit 52.

The magnetic sensor 10A according to the present embodiment has the first and second parts 32a and 32b of the second magnetic member 32 provided on the back surface side of the sensor chip 20 that protrude in the x-direction, so that the magnetic flux output from the first magnetic member 31 is bent more largely in the x-direction. As described above, the magnetic detection elements MR1 to MR4 have sensitivity to the magnetic flux in the x-direction, so that according to the magnetic sensor 10A of the present embodiment, it is possible to obtain higher magnetic detection sensitivity.

Second Embodiment

Figure 5:
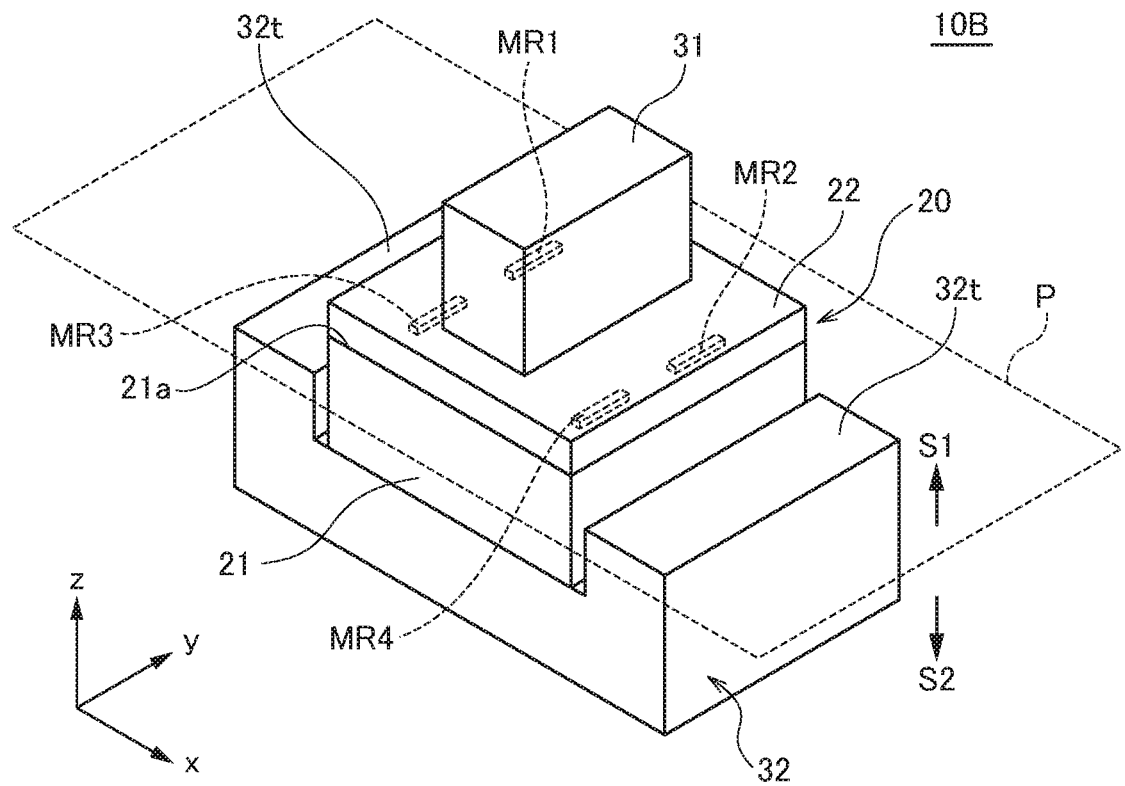
FIG. 5 is a schematic perspective view illustrating the outer appearance of a magnetic sensor 10B according to a second embodiment of the present invention.
Figure 6:
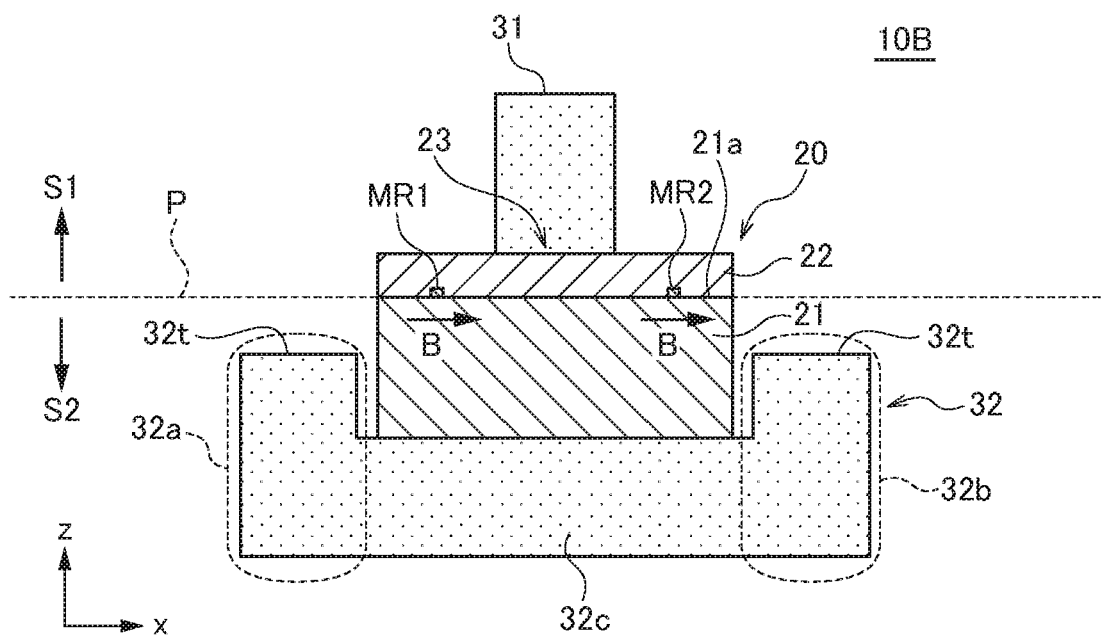
FIG. 6 is a cross-sectional view of the magnetic sensor 10B.

FIG. 5 is a schematic perspective view illustrating the outer appearance of a magnetic sensor 10B according to the second embodiment of the present invention. FIG. 6 is a cross-sectional view of the magnetic sensor 10B.

As illustrated in FIGS. 5 and 6, the magnetic sensor 10B according to the present embodiment differs from the magnetic sensor 10A according to the first embodiment in the shape of the second magnetic member 32. Other configurations are the same as those of the magnetic sensor 10A according to the first embodiment, so the same reference numerals are given to the same elements, and overlapping description will be omitted.

In the present embodiment, the first and second parts 32a and 32b of the second magnetic member 32 protrude toward the plane P side from the third part 32c. With this configuration, force with which the second magnetic member 32 bends the magnetic flux in the x-direction becomes larger, making it possible to obtain enhanced magnetic detection sensitivity.

Figure 7:
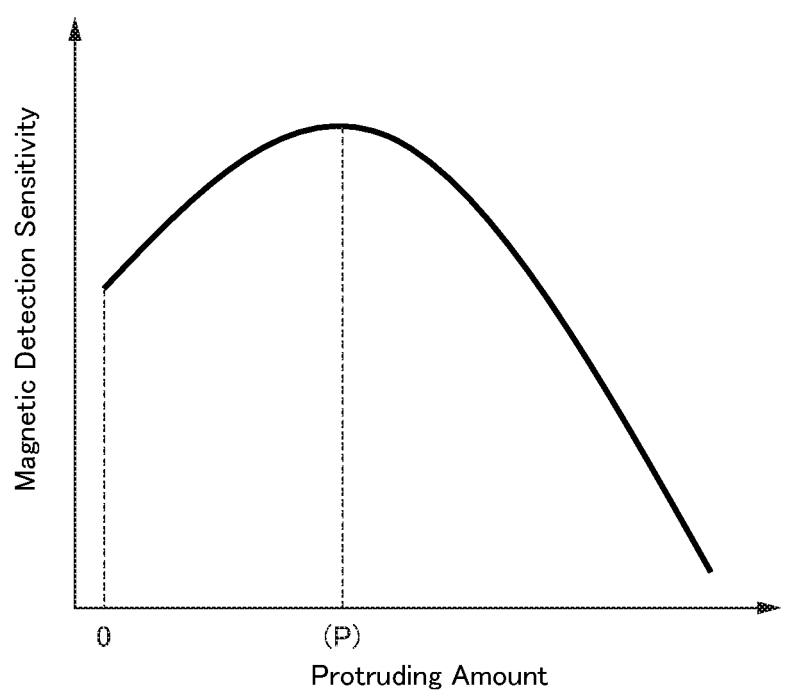
FIG. 7 is a graph schematically illustrating the relationship between the protruding amount of the first and second parts 32a and 32b in the z-direction and the detection sensitivity.

The height of the first and second parts 32a and 32b in the z-direction has significant influence on the magnetic detection sensitivity. FIG. 7 is a graph schematically illustrating the relationship between the protruding amount of the first and second parts 32a and 32b in the z-direction and the detection sensitivity. The horizontal axis indicates the protruding amount of the first and second parts 32a and 32b in the z-direction, that is, how much they protrude from the third part 32c. Thus, in the magnetic sensor 10A according to the first embodiment, the protruding amount is 0. As the protruding amount is increased, the detection sensitivity becomes higher, and when end faces 32t of the first and second parts 32a and 32b coincide with the plane P, the highest sensitivity can be obtained. However, when the protruding amount of the first and second parts 32a and 32b is increased to go beyond the plane P, the magnetic detection sensitivity rapidly deteriorates.

The reason for this trend is that the larger the protruding amount of the first and second parts 32a and 32b is, the larger the force to bend the magnetic flux in the x-direction becomes, while when the end faces 32t of the first and second parts 32a and 32b protrude over the plane P, the magnetic flux that is directed straight from the first magnetic member 31 to the second magnetic member 32 without passing through the magnetic detection elements MR1 to MR4 is increased. Considering this point, it is preferable to determine the protruding amount of the first and second parts 32a and 32b such that the end faces 32t thereof are positioned in the vicinity of the plane P.

Figure 8:
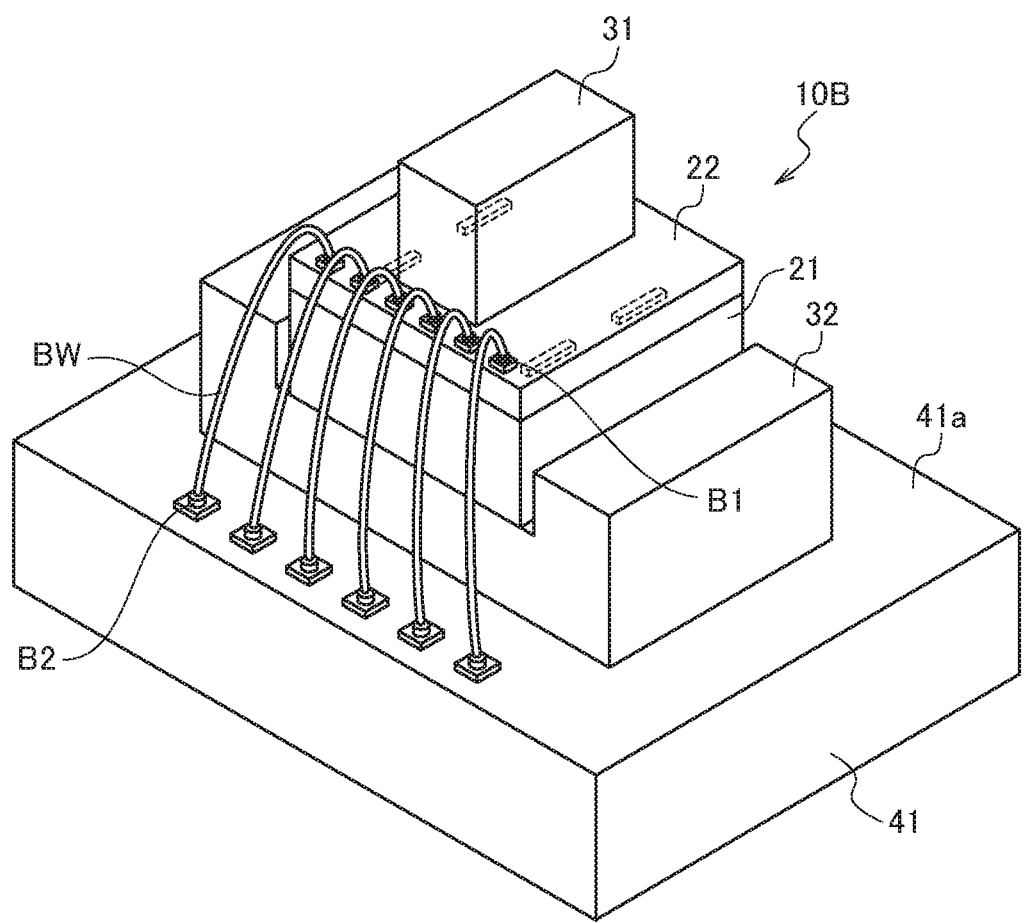
FIG. 8 is a schematic perspective view illustrating an example in which the magnetic sensor 10B is placed on a second substrate 41.
Figure 9:
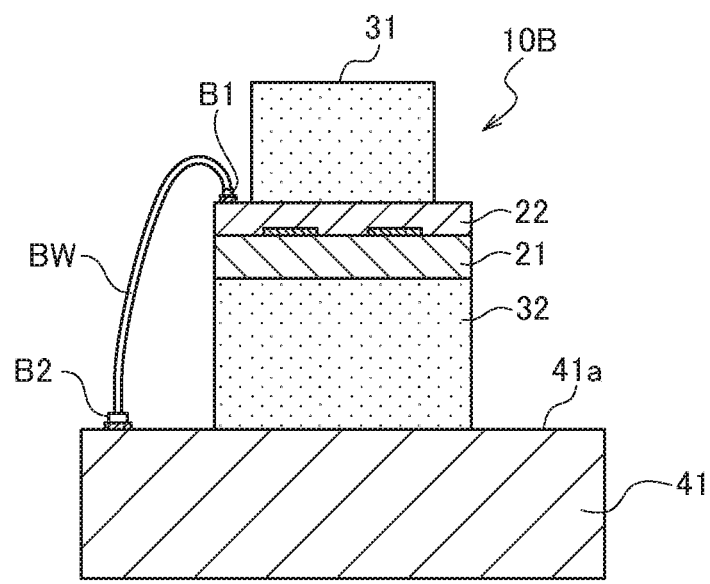
FIG. 9 is a cross-sectional view illustrating an example in which the magnetic sensor 10B is placed on a second substrate 41.

FIG. 8 is a schematic perspective view illustrating an example in which the magnetic sensor 10B according to the present embodiment is placed on a second substrate 41, and FIG. 9 is a cross-sectional view of FIG. 8.

As illustrated in FIGS. 8 and 9, the second substrate 41 has a flat plate shape, and the magnetic sensor 10B is placed on a main surface 41a of the second substrate 41. The second substrate 41 is a circuit substrate on which the constant voltage source 51 (FIG. 4), voltage detection circuit 52 (FIG. 4), and the like are formed. A plurality of bonding pads B1 are arranged on the element forming surface 21a of the sensor chip 20, and a plurality of bonding pads B2 are arranged on the main surface 41a of the second substrate 41. The bonding pads B1 and bonding pads B2 are electrically connected to each other by corresponding bonding wires BW. As described above, the magnetic sensor 10B according to the present embodiment can be placed on the second substrate 41 for practical use.

Third Embodiment

Figure 10:
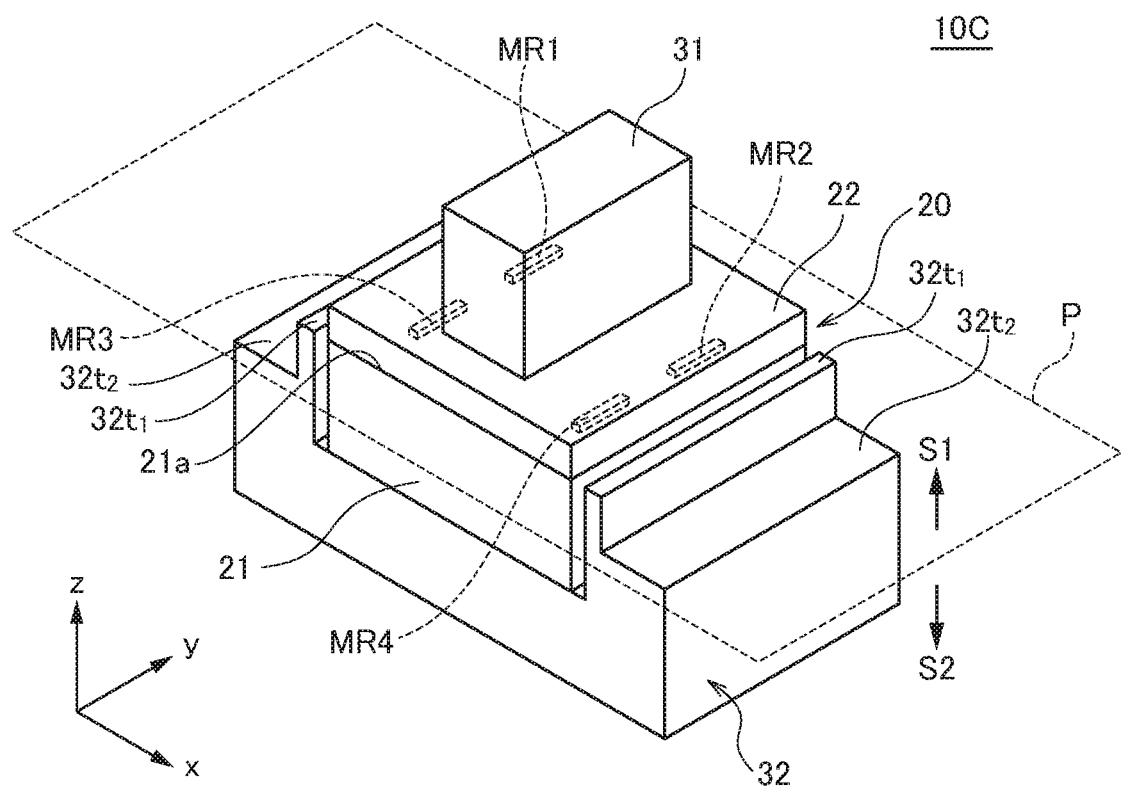
FIG. 10 is a schematic perspective view illustrating the outer appearance of a magnetic sensor 10C according to a third embodiment of the present invention.
Figure 11:
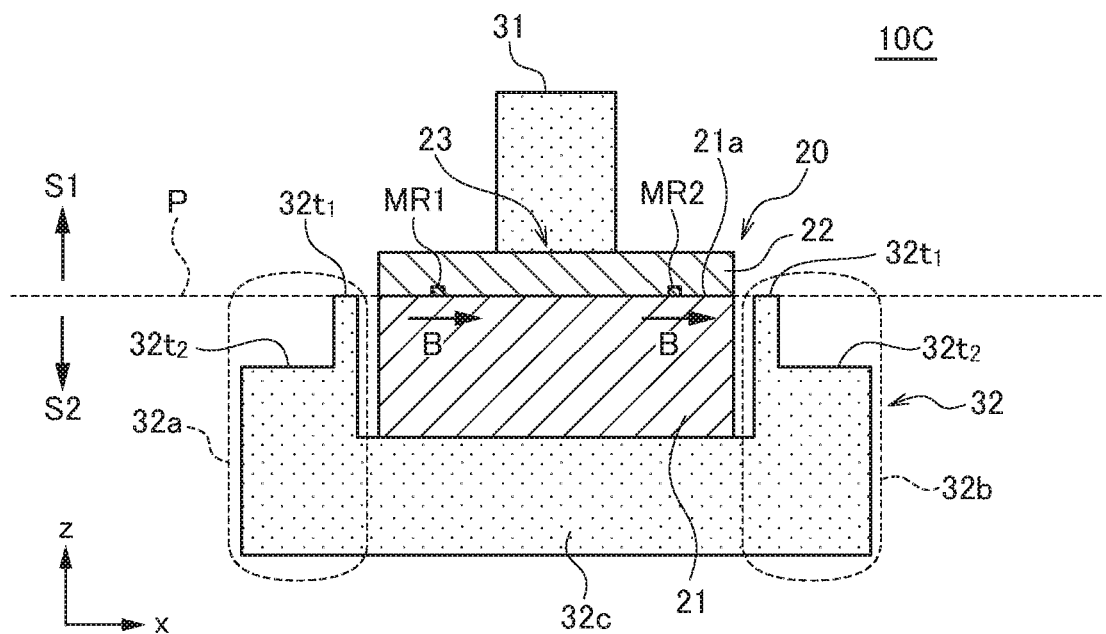
FIG. 11 is a cross-sectional view of the magnetic sensor 10C.

FIG. 10 is a schematic perspective view illustrating the outer appearance of a magnetic sensor 10C according to the third embodiment of the present invention. FIG. 11 is a cross-sectional view of the magnetic sensor 10C.

As illustrated in FIGS. 10 and 11, the magnetic sensor 10c according to the present embodiment differs from the magnetic sensor 10B according to the second embodiment in the shape of the second magnetic member 32. Other configurations are the same as those of the magnetic sensor 10B according to the second embodiment, so the same reference numerals are given to the same elements, and overlapping description will be omitted.

In the present embodiment, the first and second parts 32a and 32b of the second magnetic member 32 each have a step-like shape, in which the protruding amount thereof is large at a part near the sensor chip 20 and is small at a part remote from the sensor chip 20. Even in a case where the second magnetic member 32 has such a shape, it is possible to achieve the same effects as those obtained by the magnetic sensor 10B according to the second embodiment. Thus, it is preferable to determine the protruding amount of the first and second parts 32a and 32b such that end faces $32t_1$ thereof are positioned in the vicinity of the plane P.

Figure 12:
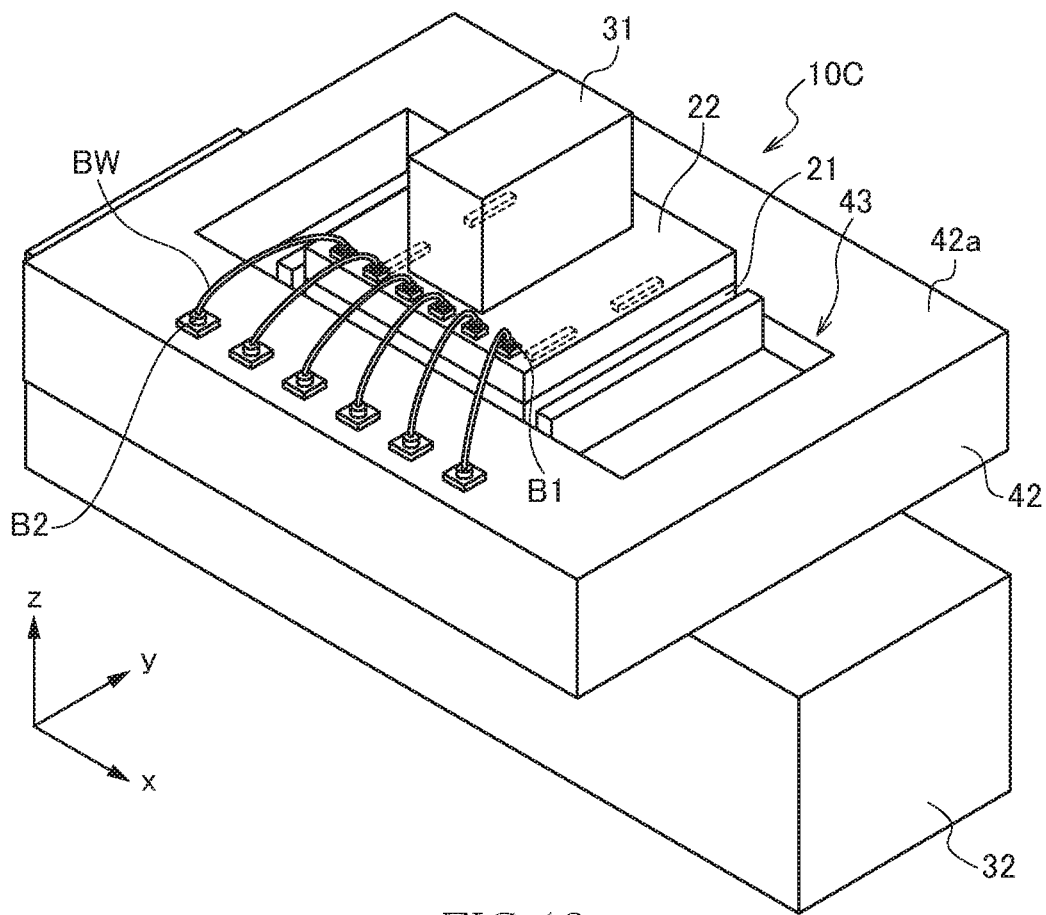
FIG. 12 is a schematic perspective view illustrating an example in which the magnetic sensor 10C is placed on a second substrate 42.
Figure 13:
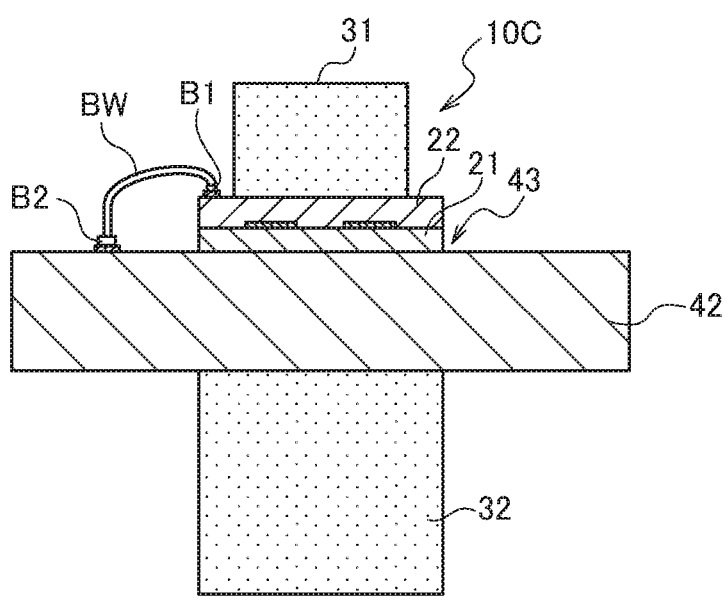
FIG. 13 is a cross-sectional view illustrating an example in which the magnetic sensor 10C is placed on a second substrate 42.

FIG. 12 is a schematic perspective view illustrating an example in which the magnetic sensor 10C according to the present embodiment is placed on a second substrate 42, and FIG. 13 is a cross-sectional view of FIG. 12.

As illustrated in FIGS. 12 and 13, the second substrate 42 has a through hole 43, and an area inside the through hole 43 serves as a housing part. The magnetic sensor 10C is fixed to the second substrate 42 such that a part of the magnetic sensor 10C is housed inside the through hole 43. In the example illustrated in FIGS. 12 and 13, the back surface of the second substrate 42 contacts end faces $32t_2$ of the second magnetic member 32, and the second substrate 42 and magnetic sensor 10C are bonded and fixed to each other at the contact portions.

With the above configuration, the height difference in the z-direction between the bonding pads B1 arranged on the sensor chip 20 and the bonding pads B2 arranged on the second substrate 42 is reduced, so that the length of the bonding wires BW can be reduced, and bonding work is facilitated. Further, the second substrate 42 has the through hole 43, so that it is possible to increase the size of the second magnetic member 32 without being restricted by the size of the housing part.

In the example illustrated in FIGS. 12 and 13, the through hole 43 penetrating the second substrate 42 serves as the housing part; alternatively, however, in place of the through hole 43, a cavity (recessed part) may be formed in the second substrate 42 as the housing part.

Figure 14:
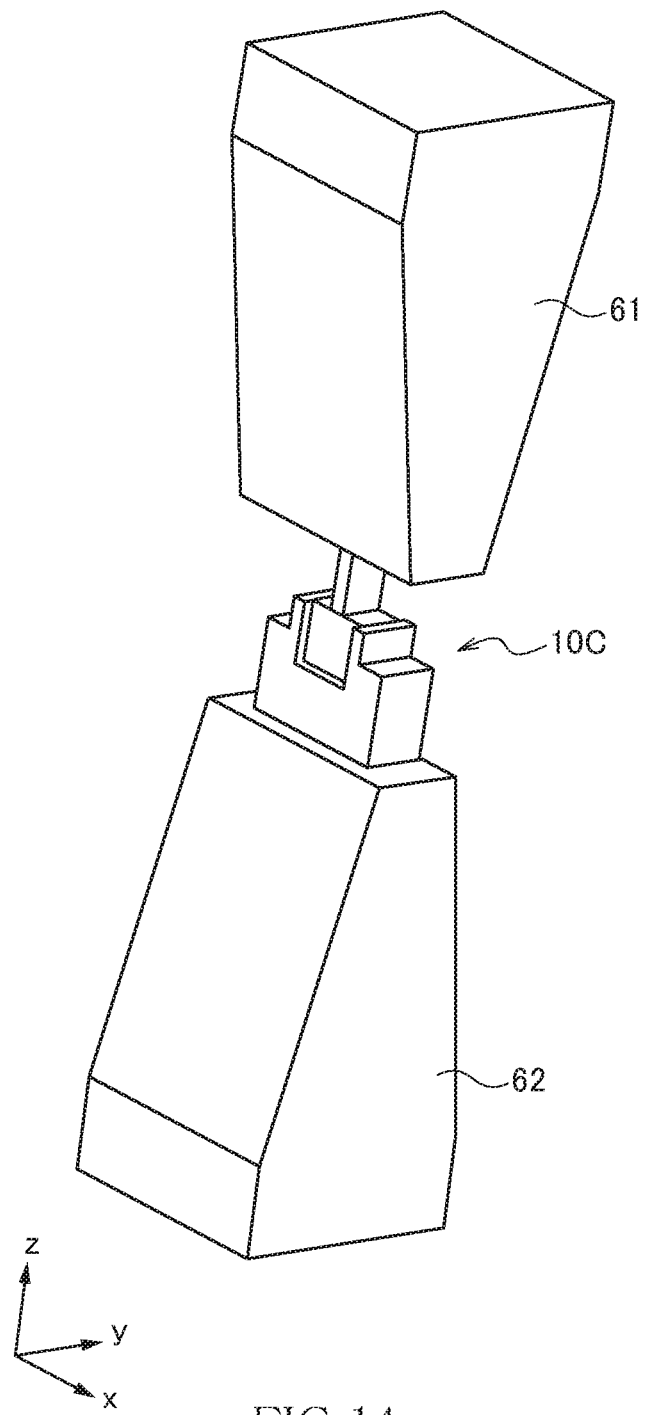
FIG. 14 is a schematic perspective view illustrating an example in which back yokes 61 and 62 are added to the magnetic sensor 10C.

FIG. 14 is a schematic perspective view illustrating an example in which back yokes 61 and 62 are added to the magnetic sensor 10C according to the present embodiment. The back yokes 61 and 62 each have a substantially trapezoidal shape in yz cross section and are connected respectively to the first magnetic member 31 and the second magnetic member 32. The back yokes 61 and 62 play a role of taking in more magnetic flux in the z-direction and concentrating the taken-in magnetic flux on the magnetic detection elements MR1 to MR4. By using the thus configured back yokes 61 and 62, higher magnetic sensitivity can be obtained.

It is apparent that the present invention is not limited to the above embodiments, but may be modified and changed without departing from the scope and spirit of the invention.

For example, while the four magnetoresistive elements (MR elements) are used as the magnetic detection element in the above embodiments, the type and number of the magnetic detection elements are not particularly limited.

REFERENCE SIGNS LIST 10A-10C magnetic sensor
20 sensor chip
21 first substrate
21a element forming surface
22 insulating film
23 mounting area
31 first magnetic member
32 second magnetic member
32a first part
32b second part
32c third part
32t, $32t_1$, $32t_2$ end face
41, 42 second substrate
41a main surface 4 of second substrate
43 through hole
51 constant voltage source
52 voltage detection circuit 61, 62 back yoke
B1, B2 bonding pad
BW bonding wire
C1, C2 connection point
MR1-MR4 magnetic detection element
P plane
S1 first space
S2 second space

What is claimed is:

1. A magnetic sensor comprising:
a plurality of magnetic detection elements including at least first and second magnetic detection elements positioned on a plane separating a first space and a second space;
a first magnetic member disposed in the first space so as to be between the first and second magnetic detection elements when viewed in a first direction crossing the plane; and
a second magnetic member disposed in the second space and having at least first and second parts,
wherein the first magnetic detection element is positioned between the first magnetic member and the first part of the second magnetic member when viewed in the first direction, and
wherein the second magnetic detection element is positioned between the first magnetic member and the second part of the second magnetic member when viewed in the first direction,
wherein the second magnetic member further includes a third part connecting the first and second parts, and located between the first and second parts, and
wherein each of the first and second parts has a shape protruding toward the plane from the third part.

2. The magnetic sensor as claimed in claim 1, wherein each of end faces of the first and second parts is positioned in a vicinity of the plane.

3. The magnetic sensor as claimed in claim 1, wherein a second direction that is parallel to the plane and is a direction in which the first and second magnetic detection elements are arranged is set as a magnetization fixing direction of the plurality of magnetic detection elements.

4. The magnetic sensor as claimed in claim 3, wherein a length of the first magnetic member in a third direction that is parallel to the plane and crosses the magnetization fixing direction is larger than a length of each of the plurality of magnetic detection elements in the third direction.

5. The magnetic sensor as claimed in claim 4, wherein a length of the second magnetic member in the third direction is larger than the length of each of the plurality of magnetic detection elements in the third direction.

6. The magnetic sensor as claimed in claim 3,
wherein the first, second, and third parts have first, second, and third side surfaces, respectively, each extending in the first and second directions, and
wherein the first, second, and third side surfaces are coplanar with one another.

7. The magnetic sensor as claimed in claim 4, wherein the first, second, and third parts have a same width in the third direction as one another.

8. The magnetic sensor as claimed in claim 1, wherein the first and second magnetic members comprise a soft magnetic material.

9. The magnetic sensor as claimed in claim 1, further comprising a first substrate on which the plurality of magnetic detection elements are formed,
wherein the first magnetic member is fixed to one surface of the first substrate, and
wherein the second magnetic member is fixed to another surface of the first substrate.

10. The magnetic sensor as claimed in claim 9, further comprising a second substrate having a housing part,
wherein at least a part of the first substrate is housed in the housing part.

11. The magnetic sensor as claimed in claim 10, wherein the housing part penetrates the second substrate.

12. The magnetic sensor as claimed in claim 1, wherein the third part comprises a soft magnetic material.

13. The magnetic sensor as claimed in claim 12, wherein the third part comprises a ferrite.

14. A magnetic sensor comprising:
a plurality of magnetic detection elements including at least first and second magnetic detection elements positioned on a plane separating a first space and a second space;
a first magnetic member disposed in the first space so as to be between the first and second magnetic detection elements when viewed in a first direction crossing the plane;
a second magnetic member disposed in the second space and having at least first and second parts;
a first substrate on which the plurality of magnetic detection elements are formed; and
a second substrate having a housing part,
wherein the first magnetic detection element is positioned between the first magnetic member and the first part of the second magnetic member when viewed in the first direction, and
wherein the second magnetic detection element is positioned between the first magnetic member and the second part of the second magnetic member when viewed in the first direction,
wherein the first magnetic member is fixed to one surface of the first substrate,
wherein the second magnetic member is fixed to another surface of the first substrate,
wherein at least a part of the first substrate is housed in the housing part, and
wherein the housing part penetrates the second substrate.

15. A magnetic sensor comprising:
a sensor chip including a first surface having a center area, a second surface located opposite to the first surface, a third surface substantially perpendicular to the first and second surfaces, and a fourth surface located opposite to the third surface;
first and second magnetic detection elements formed on the first surface so as to sandwich the center area;
a first magnetic member covering the center area of the first surface; and
a second magnetic member including a first part covering the third surface, a second part covering the fourth surface, and a third part covering the second surface,
wherein each of the first, second, and third parts comprises a soft magnetic material.

16. The magnetic sensor as claimed in claim 15, wherein each of the first, second, and third parts comprises a ferrite.

17. The magnetic sensor as claimed in claim 15,
wherein the first, second, and third parts have first, second, and third side surfaces, respectively, substantially perpendicular to each of the first, second, third, and fourth surfaces, and
wherein the first, second, and third side surfaces are coplanar with one another.

18. The magnetic sensor as claimed in claim 17,
wherein the sensor chip further includes a fifth surface substantially perpendicular to each of the first, second, third, and fourth surfaces, and
wherein the fifth surface is coplanar with each of the first, second, and third side surfaces.

19. The magnetic sensor as claimed in claim 15, wherein the first, second, and third parts have a same width as one another in a direction parallel with each of the first, second, third, and fourth surfaces.

* * * * *